(12) United States Patent
Roach

(10) Patent No.: US 6,522,083 B1
(45) Date of Patent: Feb. 18, 2003

(54) DRIVER CIRCUITRY WITH TUNED OUTPUT IMPEDANCE

(75) Inventor: Steven D. Roach, Colorado Springs, CO (US)

(73) Assignee: Linear Technology Corp., Milpitas, CA (US)

( * ) Notice: Subject to any disclaimer, the term of this patent is extended or adjusted under 35 U.S.C. 154(b) by 0 days.

(21) Appl. No.: 09/986,256

(22) Filed: Nov. 8, 2001

(51) Int. Cl.$^7$ .............................................. H05B 37/00
(52) U.S. Cl. ........................ 315/224; 315/224; 327/382; 333/32
(58) Field of Search .................... 315/224, 291, 315/248, 242, 244; 327/333, 382, 111; 333/32

(56) References Cited

U.S. PATENT DOCUMENTS

| | | | |
|---|---|---|---|
| 3,573,644 A | | 4/1971 | Evel .............................. 330/9 |
| 4,451,766 A | * | 5/1984 | Angie et al. ................. 315/248 |
| 5,111,065 A | * | 5/1992 | Roberge ...................... 327/109 |
| 5,121,075 A | | 6/1992 | Roach ......................... 330/126 |
| 5,939,909 A | * | 8/1999 | Callahan, Jr. ............... 327/108 |
| 6,130,563 A | * | 10/2000 | Pilling et al. ................ 327/111 |
| 6,140,885 A | * | 10/2000 | Abadeer et al. ............ 333/17.3 |
| 6,343,024 B1 | * | 1/2002 | Zabroda ....................... 363/22 |
| 6,362,679 B2 | * | 3/2002 | Wile ........................... 327/382 |

OTHER PUBLICATIONS

Addis, John, "Three technologies on one chip make a broadband amplifier", *Electronics The International Magazine of Electronics Technology*, Jun. 5, 1972, pp. 103–107.

Ahuja, B.K., "Implementation of Active Distributed RC Anti–Aliasing/Smoothing Filters", *IEEE Journal of Solid–State Circuits*, vol. SC–17, No. 6, pp. 339–342.

AMCC Product Brief 1.0/1.25GBPSVCELDRIVER, May 10, 1999, pp. 1–3.

Khoury, John, M., "Synthesis of Arbitrary Rational Transfer Funtions is S Using Uniform Distributed RC Active Circuits", IEEE Transactions on Circuits and Systems, vol. 37, No. 4, Apr. 1990, pp. 464–472.

Khoury, John, M., "On the Design of Constant Settling Time AGC Circuits", *IEEE Transactions on Circuits and Systems*, vol. 45, No. 3, Mar. 1998, pp. 283–294.

Sackinger, Eduard, et al., "A 3GHz, 32dB CMOS Limiting Amplifier for SONET OC–48 Receivers", *IEEE International Solid–State Circuits Conference*, 2000, pg. 158.

Summit Microelectronics, Inc. "Dual Loop Laser Diode Adaptive Power Controller with Look Up Table" (SML2108), Oct. 3, 2001, pp. 1–21.

Swartz, R.G. et al., "An Integrated Circuit for Multiplexing and Driving Injection Lasers", *IEEE Journal of Solid–State Circuits*, vol. SC–17, No. 4, Aug. 1982, pp. 753–760.

Dascher, David J., "Measuring Parasitic Capacitance and Inductance Using TDR", *Hewlett–Packard Journal*, Apr. 1996, pp. 1–19.

Ikäläinen, Pertti K., "An RLC Matching Network and Application in 1–20 GHZ Monolithic Amplifier", *IEEE*, 1989, pp. 1115–1118.

Maxium, "Interfacing Maxim Laser Drivers with Laser Diodes", May 2000, pp. 1–12.

* cited by examiner

*Primary Examiner*—Don Wong
*Assistant Examiner*—Ephrem Alemu
(74) *Attorney, Agent, or Firm*—Fish & Neave; Michael E. Shanahan

(57) ABSTRACT

Driver circuitry with a tuned output impedance is provided. Tuning is provided by an isolation circuit and matching network coupled to an output of the driver circuit. The isolation circuit isolates the capacitance associated portions of the driver circuit thereby reducing overall output capacitance. The matching network substantially compensates for reactive impedances associated with other portions of the driver circuit. These tuning circuits allow the driver circuit overcome intrinsic reactance and exhibit a substantially resistive output impedance characteristic.

31 Claims, 2 Drawing Sheets

US 6,522,083 B1

DRIVER CIRCUITRY WITH TUNED OUTPUT IMPEDANCE

BACKGROUND OF THE INVENTION

This invention relates to driver circuitry. More particularly, this invention relates to circuits and methods for providing driver circuitry with a tuned output impedance.

In the past, the semiconductor industry has utilized various configurations of "driver circuitry" for supplying power to loads that are external to an integrated circuit. Common examples of such external loads include transmission lines, communication systems, and electric motors. One characteristic of driver circuitry that is of concern to system designers is output impedance. As a general principle, it is desirable to match the output impedance of the driver circuitry as closely as possible to the input impedance of the load to maximize power transfer and minimize signal reflections.

In certain applications, such as those involving power transmission or lighting systems, a closely matched impedance is not critical. Other applications, however, such as high speed communications systems, often rely on near-perfect impedance matches to properly function.

Historically, impedance matching has been accomplished by coupling a precision resistor between the driver circuit and the load to provide proper line termination. One deficiency of this approach, however, is that it fails to account for the output capacitance associated with the driver circuit. Because the response time of the driver circuitry is directly dependent on output capacitance, it is generally desirable to minimize this value to approximate a substantially resistive output characteristic. This is particularly desirable in applications that involve high speed data transfer.

Thus, in view of the foregoing, it would therefore be desirable to provide circuits and methods that compensate for the effects of output capacitance on driver circuit performance.

SUMMARY OF THE INVENTION

It is an object of the present invention to provide circuits and methods that compensate for the effects of output capacitance on driver circuit performance.

This and other objects are accomplished in accordance with the principles of the present invention by providing driver circuitry with a tuned output impedance. The tuning function of the present invention is provided by an isolation circuit and matching network coupled to an output of the driver circuit. The isolation circuit isolates the capacitance associated portions of the driver circuit thereby reducing overall output capacitance. The matching network substantially compensates for reactive impedances associated with other portions of the driver circuit. Employing these circuits simultaneously allows the driver circuit to overcome intrinsic reactance and exhibit a substantially resistive output impedance characteristic.

Furthermore, the components used in the isolation circuit and matching network may be selected so that the output impedance of the driver circuit substantially matches that of an external load such as a transmission line or light emitting element. This solution eliminates the need for external damping components and provides significantly improved high frequency performance.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
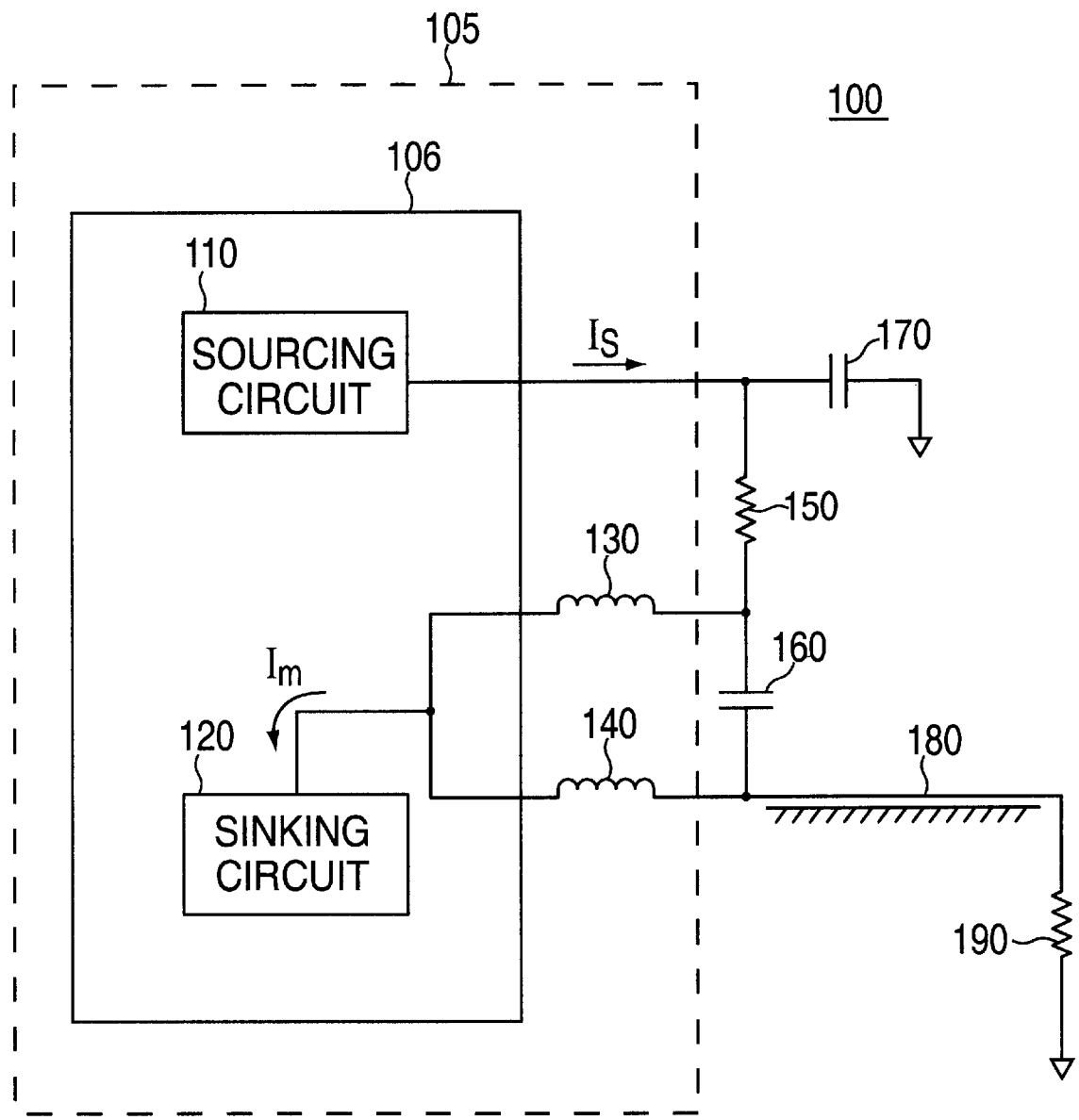
FIG. 1 is schematic diagram of a driver circuit constructed in accordance with the principles of the present invention.

FIG. 1 is a schematic diagram of a driver circuit 100 constructed in accordance with the principles of the present invention. Driver circuit 100 includes a sourcing circuit 110, a sinking circuit 120, inductors 130 and 140, an isolation resistor 150, and capacitors 160 and 170.

Transmission line 180 and load 190 represent an external load driven by circuit 100. Although other arrangements are possible, sourcing circuit 110 and sinking circuit 120 are preferably disposed on a semiconductor die 106 and inductors 130 and 140 may be formed from material present on a typical integrated circuit package 105 (e.g., bond wire).

In operation, sourcing circuit 110 may provide a substantially constant source current ($I_S$) to isolation resistor 150 and load 190 (through transmission line 180). Sourcing circuit 110 may include any circuit configuration suitable for providing current such as current mirror type bias circuitry.

The current $I_S$ supplied to load 190 may be varied by periodically switching sinking circuit 120 ON and OFF, allowing a modulation current ($I_M$) to pass through it during an ON state, and acting as an open circuit during an OFF state. In this way, a voltage differential is applied across load 190 to provide signal modulation.

Although driver circuit 100 is suitable for driving a wide variety of loads, it is particularly suitable for use in optical communication systems wherein load 190 is a light emitting element such as a laser diode, a vertical cavity surface emitting laser (VCSEL), or light emitting diode (LED) etc. In this case, signal modulation is used to switch load 190 ON and OFF to produce binary optical signals.

In some embodiments of the present invention, sinking circuit 120 may be configured to turn ON and OFF partially to improve response time. Sinking circuit 120 may include any circuitry suitable for switching between ON and OFF states such as a transistor or armature type switch.

Capacitor 170 is coupled in parallel with isolation resistor 150 and preferably has a value large enough to support low frequency operation.

Isolation resistor 150 provides three important benefits to circuit 100. First, it acts as a line termination to match the characteristic impedance of transmission line 180. Second, it prevents high frequency signals generated by sinking circuit 120 from being introduced onto a power plane coupled to sourcing circuit 110 (not shown). Third, it reduces the overall output capacitance of driver circuit 100 by isolating the capacitance associated with sourcing circuit 110. The reduction of output capacitance decreases the time constant of driver circuit 100, improving high frequency response.

As shown in FIG. 1, the frequency response of driver circuit 100 may be further improved by the addition of a broadband matching network formed by inductors 130 and 140. Because inductors 130 and 140 are coupled in parallel, the overall package inductance driven by sinking circuit 120 is lowered. Using this configuration, it is possible to obtain a substantially resistive output impedance characteristic by compensating for the capacitance associated sinking circuit 120. This may be accomplished by selecting certain values for inductors 130 and 140 that satisfy the following equations. For example, the output impedance associated with sinking circuit 120 will be substantially resistive if:

$$Z_0^2 = L/C_N; \quad (1)$$
$$C_{BR} = C_N/4 \quad (2)$$

where $Z_0$ is the characteristic impedance of transmission line 180, $C_N$ is the output capacitance associated with sinking circuit 120, $C_{BR}$ is the capacitance between inductors 130 and 140, and L is the total inductance of inductors 130 and 140.

Thus, as can be seen from the above, combining an isolation resistor with a broadband matching network in circuit 100 essentially "tunes out" driver capacitance and package inductance and provides a substantially resistive output impedance (i.e., within about ±5% of a purely resistive impedance characteristic).

From a functional standpoint, this can be viewed as supplying a specified inductance to tune out the frequency effects of output capacitance or vice-versa. Because this technique is not frequency dependent, it eliminates the need for cumbersome external damping networks. Moreover, the resonant frequency of driver circuit 100 is substantially increased, permitting a broader range of high frequency operation (e.g., by a factor of about 1.41). This result is particularly desirable in optical communications systems that constantly strive to accommodate increasing data rates.

In some embodiments of the present invention, it may not be possible to obtain a substantially resistive impedance without isolating the capacitance associated with sourcing circuit 110. For example, if the capacitance value needed to obtain a certain output characteristic is less than the intrinsic output capacitance of driver 100, at least some isolation of sourcing circuit 110 is necessary.

Assume, for example, that inductors 130 and 140 each have a 2 nH value and transmission line 180 has a characteristic impedance of 50 Ohms. In this case, using equation 1, a substantially resistive impedance is achieved when the output capacitance of circuit 100 is 1.6 pF. Consequently, if the intrinsic output capacitance of driver circuit 100 is greater than 1.6 pF, at least some isolation of sourcing circuit 110 will be required.

Figure 2:
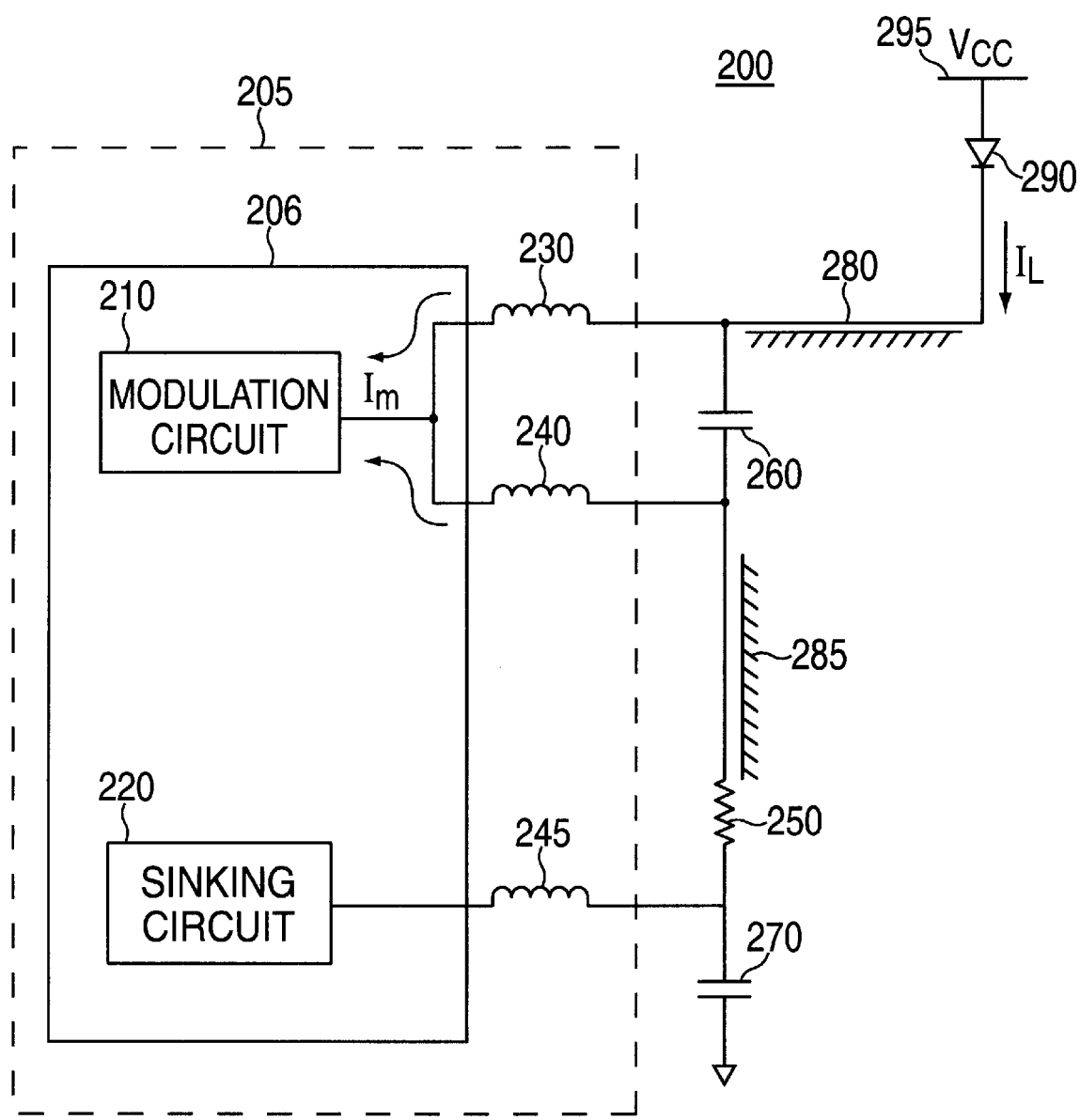
FIG. 2 is a schematic diagram another driver circuit constructed in accordance with the principles of the present invention.

Another driver circuit constructed in accordance with the principles of the present invention is shown in FIG. 2. Driver circuit 200 is similar to driver circuit 100 in many ways and represents one specific embodiment of the present invention suitable for driving a light emitting element. As shown in FIG. 2, driver circuit 200 includes a modulation circuit 210, a sinking circuit 220, inductors 230, 240, and 245, an isolation resistor 250, and capacitors 260 and 270.

Transmission lines 280 and 285 and laser diode 290 represent an external load driven by circuit 200. Although other arrangements are possible, modulation circuit 210 and sinking circuit 220 are preferably disposed on a semiconductor die 206 and inductors 230, 240, and 245 may be formed from material on an integrated circuit package 205 (e.g., bond wire).

In operation, a current $I_L$ flows from voltage source 295 ($V_{cc}$) through laser diode 290, transmission lines 280 and 285, isolation resistor 250, and into sinking circuit 220. Current $I_L$ is typically set such that laser diode 290 is ON (i.e., in a conducting state) but with an optical output indicative of a "logic low" signal. Sinking circuit 220 may be any circuit configuration suitable for biasing laser diode 290.

The current drawn from laser diode 290 may be varied by periodically switching modulation circuit 210 ON and OFF, allowing a modulation current ($I_M$) to pass through it during an ON state, and acting as an open circuit during an OFF state. During an ON state, additional current is drawn from the cathode of laser diode 290, turning it ON further and causing it to produce an optical output indicative of a "logic high" signal. Thus, optical data signals may be obtained from laser diode 290 by switching modulation circuit 290 between ON and OFF states. In some embodiments, modulation circuit 210 may be configured to turn ON and OFF partially to improve response time. Modulation circuit 210 may include any circuitry suitable for switching between ON and OFF states such as a transistor or armature type switch.

Capacitors 260 and 270 and isolation resistor 250 perform substantially the same functions as their counterpart components in FIG. 1 (i.e., capacitors 160 and 170 and resistor 150). Furthermore, circuit 200 may be arranged to provide a substantially resistive output characteristic by following the relationships set forth equations 1 and 2.

Providing the proper inductance values for the inductors shown in FIGS. 1 and 2 may be accomplished in a number of ways. One method involves the use of "static compensation" technique. The first step in this method involves determining the output capacitance associated with the driver circuit. This may be accomplished by manufacture and measurement or by calculation.

Next, an inductor of the proper value is designed from material normally present on an integrated circuit package such as bond wire and/or a package lead. The value of these inductors may be altered by changing the length, width, spacing, or material from which they are constructed. Once designed, the inductors are incorporated into the integrated circuit manufacturing process so that the final product has the inductor present in the integrated circuit package, and thus the desired output impedance characteristic. This process is known as static compensation due to the difficulty involved with altering the inductance value on the chip after it has been produced.

Another way of providing a specific inductor value involves a "active compensation" technique. With this method, an adjustable inductor is disposed on the die of the driver circuit rather than constructing it from packaging materials. After fabrication of the driver circuit is complete, either the manufacturer or a user may adjust the inductor (e.g., by trimming) to obtain a desired inductor value and thus a certain output impedance.

In some embodiments of the present invention it may be desirable to provide driver circuitry that is under compensated (i.e., with inductance values less than that needed to provide a substantially resistive output characteristic). This allows users to set the output impedance of the driver circuit to a specific desired value by adding additional external components. In this way, it is possible for users to match the impedance of the driver circuitry to a wide range of external loads such as transmission lines and light emitting elements.

Persons skilled in the art will appreciate that the present invention can be practiced by other than the described embodiments, which are presented for purposes of illustration and not of limitation, and the present invention is limited only by the claims which follow.

What is claimed is:

1. A method for obtaining a substantially resistive output impedance characteristic from a driver circuit comprising:
   isolating a reactive impedance associated with a sourcing circuit from a load; and compensating for a reactive impedance associated with a sinking circuit to obtain a substantially resistive output characteristic from the sinking circuit.

2. The method of claim 1 wherein said isolating further comprises providing an isolation resistance.

3. The method of claim 1 wherein the reactive impedance associated with the sourcing circuit is derived at least in part from parasitic capacitance.

4. The method of claim 1 wherein the reactive impedance associated with the sinking circuit is derived at least in part from parasitic capacitance.

5. The method of claim 1 wherein the compensating further comprises providing a reactive network coupled to the sinking circuit to substantially cancel reactive effects associated with the sinking circuit.

6. The method of claim 5 wherein the providing a reactive network further comprises providing a broadband matching network.

7. The method of claim 5 wherein the providing a reactive network further comprises selecting the reactive network such that the output impedance of the driver circuit substantially matches a characteristic impedance of a transmission line.

8. The method of claim 5 wherein the providing a reactive network further comprises providing an inductance.

9. The method of claim 8 wherein the providing an inductance further comprises providing an adjustable inductor disposed on a semiconductor die.

10. The method of claim 8 wherein the inductance is at least partially derived from a lead of a semiconductor package.

11. The method of claim 8 wherein the inductance is at least partially derived from a bond wire of a semiconductor package.

12. A method for driving a load comprising:
providing a sourcing circuit that sources current to the load,
isolating a reactive impedance associated with the sourcing circuit from the load;
providing a sinking circuit that sinks current from the load; and
compensating for a reactive impedance associated with the sinking circuit to achieve a substantially resistive output characteristic from the sinking circuit.

13. The method of claim 12 wherein said isolating further comprises providing an isolation resistance.

14. The method of claim 12 wherein the compensating further comprises providing a reactive network coupled to the sinking circuit to substantially cancel reactive effects associated with the sinking circuit.

15. The method of claim 14 wherein the providing a reactive network further comprises providing a broadband matching network.

16. The method of claim 14 wherein the providing a reactive network further comprises selecting the reactive network such that the output impedance of the driver circuit substantially matches a characteristic impedance of a transmission line.

17. The method of claim 14 wherein the providing a reactive network further comprises providing an inductance.

18. The method of claim 17 wherein the providing an inductance further comprises providing an adjustable inductor disposed on a semiconductor die.

19. The method of claim 17 wherein the inductance is at least partially derived from a lead of a semiconductor package.

20. The method of claim 17 wherein the inductance is at least partially derived from a bond wire of a semiconductor package.

21. A method for driving a light emitting element coupled to a transmission line comprising:
providing a bias circuit that supplies a bias current to the light emitting element,
isolating reactive impedance associated with the bias circuit from the light emitting element;
providing a modulation circuit that supplies modulation current to the light emitting element; and
compensating for a reactive impedance associated with the modulation circuit to achieve a substantially resistive output characteristic so that an impedance of the modulation circuit and a characteristic impedance of the transmission line substantially match.

22. A circuit for tuning the output impedance of driver circuit to obtain a substantially resistive output impedance characteristic comprising:
an isolation resistor coupled to a sourcing circuit that isolates a reactive impedance associated with a sourcing circuit from a load; and
a reactive network configured to compensate for a reactive impedance associated with a sinking circuit to obtain a substantially resistive output characteristic from the sinking circuit.

23. The tuning circuit of claim 22 wherein the reactive network further comprises a broadband matching network.

24. The tuning circuit of claim 22 wherein the reactive network further comprises components for tuning the output impedance of the driver circuit such that the output impedance substantially matches a characteristic impedance of a transmission line.

25. The tuning circuit of claim 22 wherein the reactive network further comprises at least one inductor.

26. The tuning circuit of claim 25 wherein the at least one inductor is an adjustable inductor disposed on a semiconductor die.

27. The tuning circuit of claim 25 wherein the at least one inductor inductance is formed, at least partially, from a lead of a semiconductor package.

28. The tuning circuit of claim 25 wherein the at least one inductor inductance is formed, at least partially, from a lead of a bond wire of a semiconductor package.

29. A circuit for driving a load comprising:
a modulator circuit for providing a modulated signal to the load;
a reactive network coupled to the modulator circuit and to the load that substantially compensates for a reactive impedance associated with the modulation circuit to achieve a substantially resistive output characteristic from the modulator circuit;
a bias circuit for providing a bias signal to the load; and
an isolation circuit coupled to the bias circuit and to the modulator circuit for isolating a reactive impedance associated with the bias circuit from the load.

30. The circuit defined in claim 29 wherein the isolation circuit includes an isolation resistor.

31. The driver circuit of claim 29 wherein the reactive network further comprises components for turning the output impedance of the driver circuit such that the output impedance substantially matches a characteristic impedance of a transmission line.

* * * * *